United States Patent [19]

Coehoorn et al.

[11] Patent Number: 5,686,837
[45] Date of Patent: Nov. 11, 1997

[54] MAGNETIC FIELD SENSOR AND INSTRUMENT COMPRISING SUCH A SENSOR

[75] Inventors: Reinder Coehoorn; Gerjan F. A. Van De Walle, both of Eindhoven, Netherlands

[73] Assignee: U.S. Philips Corporation, New York, N.Y.

[21] Appl. No.: 423,607

[22] Filed: Apr. 17, 1995

[30] Foreign Application Priority Data

Apr. 15, 1994 [EP] European Pat. Off. ............. 94201032

[51] Int. Cl.$^6$ ............................. G01R 33/09; H01L 43/08
[52] U.S. Cl. ................................. 324/252; 338/32 R
[58] Field of Search ..................... 324/207.21, 207.2, 324/252, 251, 225, 207.12; 338/32 R, 32 H; 360/113; 29/603

[56] References Cited

U.S. PATENT DOCUMENTS

| | | | |
|---|---|---|---|
| 4,093,917 | 6/1978 | Haeussermann | 324/207.2 X |
| 4,639,807 | 1/1987 | Sekizawa et al. | 360/113 |
| 4,851,771 | 7/1989 | Ikeda et al. | 324/207.21 X |
| 5,055,786 | 10/1991 | Wakatsuki et al. | 324/252 |
| 5,206,590 | 4/1993 | Dieny et al. | 324/252 X |
| 5,422,571 | 6/1995 | Gorney et al. | 324/252 X |

FOREIGN PATENT DOCUMENTS 0442407  8/1991  European Pat. Off. .

OTHER PUBLICATIONS

"GMR Materials For Low–Field Applications" J.M. Daughton et al, IEEE Transactions On Magnetics, vol. 29, p. 7705, 1994.

Primary Examiner—Sandra L. O'Shea
Assistant Examiner—Roger Phillips
Attorney, Agent, or Firm—Robert J. Kraus

[57] ABSTRACT

A magnetic field sensor is composed of layered magnetoresistive elements which are arranged in a bridge on a substrate. The magnetoresistive elements comprise two ferromagnetic layers which exhibit an uni-axial anisotropy in one plane and are separated by a non-ferromagnetic layer. During the manufacture of the sensor the magnetization directions of these ferromagnetic layers are laid down so that two elements in two adjacent branches of the bridge exhibit an opposed sensitivity to external magnetic fields. Moreover, in each magnetoresistive element the magnetization of a ferromagnetic layer is adjusted substantially perpendicularly to the magnetization direction of the other ferromagnetic layer. As a result auxiliary fields are no longer required for the measurement of small magnetic fields and the sensor is substantially free of hysteresis and has an enhanced linearity.

23 Claims, 6 Drawing Sheets

MAGNETIC FIELD SENSOR AND INSTRUMENT COMPRISING SUCH A SENSOR

BACKGROUND OF THE INVENTION

1. Field of Invention

This invention relates to a magnetic field sensor, comprising a Wheatstone bridge with at least four layered magnetoresistive elements on a substrate, each element being composed of at least three layers, comprising successively a first ferromagnetic layer, a non-magnetic layer and a second ferromagnetic layer.

2. Description of the Related Art

Magnetic field sensors are used, inter alia, in compasses, in medical instruments, for measurement of rotation, acceleration and position, and in magnetic recording systems.

A magnetic field sensor of the kind set forth is known from the publication by J. M. Daughton and Y. J. Chen, "GMR Materials for low-field applications", IEEE Transactions on Magnetics, Vol. 29, page 7705, 1994. The magnetoresistive elements described in the cited publication have a so-called Giant Magnetic Resistance effect. In the described multilayer magnetoresistive elements the resistance is dependent on the angle between the magnetization directions of the ferromagnetic layers. The resistance of these materials is low when the two magnetization directions of the ferromagnetic layers are parallel and is high when they are antiparallel. This effect is utilized to measure external magnetic fields. The resistance variation in the magnetoresistive elements described in the cited article is of the order of from 2 to 10 percent in the range from 0 to 100 Oe (=8 kA/m).

It also appears from the cited article that for operation of the described Wheatstone bridge with maximum sensitivity it is necessary that two magnetoresistive elements in opposite branches have the same sensitivity and that two magnetoresistive elements in adjacent branches have the opposite sensitivity to the same magnetic field. The known magnetoresistive elements, however, all have the same, symmetrical characteristic in the absence of an external magnetic field. This means that for a field strength H=0, all elements have the same sensitivity to changes in an external magnetic field. For a suitable operation of the bridge, therefore, it is necessary to generate magnetic auxiliary fields at the area of the magnetoresistive elements. The directions of these magnetic auxiliary fields of two opposite elements are then the same and the directions of the magnetic auxiliary fields of two adjacent elements are opposed, so that an external field attenuates the total magnetic field for one pair of elements and intensifies the total magnetic field for another pair of elements. A pair of magnetoresistive elements in opposite branches of the bridge then exhibits a decrease of the resistance whereas the other pair of magnetoresistive elements exhibits an increase of the resistance.

Consequently, it is always necessary to use magnetic auxiliary fields in known sensors comprising magnetoresistive elements based on the described Giant Magnetic Resistance effect.

SUMMARY OF THE INVENTION

It is, inter alia, an object of the invention to provide a magnetic field sensor in which the sensitivities desired for the position within the bridge are intrinsically laid down in the magnetoresistive elements, so that no external magnetic auxiliary fields are required for measurements in an operating range around H=0.

A magnetic field sensor of the kind set forth in accordance with the invention is characterized in that each of the magnetoresistive elements comprises one or more strip-shaped portions which extend in mutually parallel directions, that the first ferromagnetic layer exhibits uni-axial anisotropy in one plane and the second ferromagnetic layer exhibits uni-axial or uni-directional anisotropy in one plane, the magnetization of the second ferromagnetic layer being determined by exchange interaction with an antiferromagnetic layer provided on the second ferromagnetic layer, and that magnetoresistive elements arranged in two adjacent branches of the bridge circuit have approximately opposite magnetization directions of the second ferromagnetic layers.

As a result of this step, the sensitivity of the magnetoresistive elements is positive and negative, respectively, depending on the magnetization direction of the second ferromagnetic layer relative to a magnetic field to be measured, and external magnetic fields are no longer required to adjust a positive or negative sensitivity for measurements around the field strength H=0.

The first ferromagnetic layer exhibits a uni-axial anisotropy in one plane due to the growth in a magnetic field. The interaction between the antiferromagnetic layer and the second ferromagnetic layer effectively results in uni-directional anisotropy of the second ferromagnetic layer. This effect is referred to as exchange biasing in the literature. Approximately opposite magnetization directions of the ferromagnetic layers are to be understood to mean magnetization directions which enclose an angle in a range of between 160° and 200° relative to one another.

In the literature the Giant Magnetic Resistance effect of these materials is also referred to as spin-valve effect.

A special embodiment of a magnetic field sensor in accordance with the invention is characterized in that, in the absence of an external magnetic field, in each magnetoresistive element the magnetization of the first ferromagnetic layer extends substantially perpendicularly to the magnetization of the second ferromagnetic layer.

The non-prepublished European Patent Application No. 93202875.6 (which is not by this discussion admitted to be prior art) describes a step to manufacture sensors based on the spin-valve effect which have better properties as regards linearity and hysteresis than the known sensors based on the spin-valve effect. This step implies that in the absence of an external magnetic field the magnetization direction, i.e. the anisotropy of the first ferromagnetic layer, extends substantially perpendicularly to the direction of the effective anisotropy, i.e. the magnetization of the second ferromagnetic layer. The effective anisotropy is the result of the exchange bias field due to the antiferromagnetic layer and the crystalline anisotropy of the second ferromagnetic layer. It is to be noted that for a magnetoresistive element in which the antiferromagnetic layer is replaced by a ferromagnetic layer having a high coercivity, the effective anisotropy of the second ferromagnetic layer can also be laid down by exchange interaction. Thus, in the context of the present Patent Application an antiferromagnetic layer is also to be understood to mean a ferromagnetic layer having a high coercivity.

The magnetization direction of the first ferromagnetic layer relative to the second ferromagnetic layer, and hence the resistance of the element, is determined by the presence and magnitude of a magnetic field to be measured.

An embodiment of such a magnetic field sensor then has a substantially linear characteristic in the range around the field strength H=0 and a better signal-to-noise ratio in comparison with a known sensor based on the spin-valve effect with parallel magnetization directions of the ferromagnetic layers.

A next embodiment of such a magnetic field sensor is characterized in that each strip-shaped portion comprises several single domain structures, which are placed adjacent to each other in a direction parallel to the longitudinal direction of the strip-shaped portion and connected to each other by a conductor.

The effective permeability of a magnetoresistive sensor element, and thereby the sensitivity to an external magnetic field, will be determined by the combined effect of the intrinsic magnetic anisotropy of the material and the shape anisotropy. The intrinsic magnetic anisotropy may for certain alloys be very small, leading to a very high magnetic permeability, and thereby to a very high sensitivity in sensor applications. However, in a magnetoresistive structure with a large length to width ratio the resulting shape anisotropy diminishes the effective magnetic permeability, thereby diminishing the sensitivity of magnetic resistive sensors with such a shape. The effect of shape anisotropy is that it stabilizes the magnetisation along the long axis of the structure. In order to increase the sensitivity the long strips have been broken up into several single domain structures. No shape anisotropy is obtained for a circle-shaped structure.

A next embodiment of such a magnetic field sensor is characterized in that the single domain structures of several adjacent strip-shaped portions form a hexagonal grid. The arrangement of the single domain structures of adjacent strip-shaped portions in hexagonal grid patterns diminishes the effect on the sensitivity by mutual interactions between the single domain structures.

A next embodiment of a magnetic field sensor in accordance with the invention is characterized in that in the immediate vicinity of each strip-shaped portion of a magnetoresistive element there is provided a current conductor whose longitudinal direction extends parallel to the longitudinal direction of the strip-shaped portion of the magnetoresistive element, the magnetization direction of the second ferromagnetic layer of the associated magnetoresistive elements extending substantially perpendicularly to the longitudinal direction of the current conductors.

This step aims to enable the magnetoresistive elements of the sensor to generate a magnetic auxiliary field by means of a current flowing through the conductors, which auxiliary field extends substantially perpendicular to the longitudinal direction of said portions. These auxiliary fields can be used to operate the magnetic field sensor in an optimum range of the characteristic.

A further embodiment of a magnetic field sensor in accordance with the invention is characterized in that a trimmer resistor is connected in series with at least one magnetoresistive element.

Addition of one or more resistors enables compensation for possible unbalance of the bridge as caused by deviations of the elements in the bridge relative to one another. This is of importance for measurements on small static magnetic fields.

An instrument for measuring a magnetic field may be provided with a sensor in accordance with the invention.

An embodiment of such an instrument is characterized in that it comprises a control unit which is arranged to conduct a current through each of the current conductors in order to generate a magnetic auxiliary field for adjustment of a working point in the characteristic for the measurement of an external field.

As a result of this step, a sensor can be operated in a range which is optimum for a desired measurement.

For example, the working point can be adjusted in a range exhibiting maximum sensitivity or in a substantially linear range.

A further embodiment of such an instrument is characterized in that the instrument comprises a control unit which is arranged to conduct a current through each of the current conductors whereby the output voltage of the bridge is maintained at a constant value by feedback, and also comprises means for measuring the current flowing through the current conductors.

As a result of this step a magnetic auxiliary field is generated which has a magnitude equal to that of an external field to be measured but an opposite direction, the value of a current flowing through the current conductors being a measure of the measured external magnetic field. This measurement results in a more linear behaviour which is insensitive to temperature fluctuations.

A further embodiment of such an instrument is characterized in that it comprises a control unit which is arranged to conduct a current through each of the current conductors in order to generate a magnetic field for saturating the magnetoresistive elements.

This step enables correction of the zero deviation of the bridge. This is of importance for the measurement of small smile magnetic fields. The saturation of the magnetoresistive elements can be achieved for positive as well as negative field directions, in dependence on the direction of the applied current.

A method of manufacturing a magnetic field sensor in accordance with the invention is characterized in that the second ferromagnetic layer and the antiferromagnetic layer are exposed, at a temperature higher than the blocking temperature, to a magnetic field which is generated by an electric current flowing in the current conductors, after which the temperature of said layers is lowered to a value below the blocking temperature while the magnetic field is sustained.

This step fixes the direction of the effective anisotropy of the second ferromagnetic layer during the production, and hence the sensitivity of each magnetoresistive element in the Wheatstone bridge. The blocking temperature is the temperature at which the exchange bias field of the second ferromagnetic layer is substantially zero. The blocking temperature of, for example, a suitable FeMn alloy is 140° C. Another suitable material is, for example, NiO.

BRIEF DESCRIPTION OF THE DRAWING

The above and other, more detailed aspects of the invention will be described in detail hereinafter, by way of example, with reference to the drawing.

The drawing consists of the following Figures.

DETAILED DESCRIPTION OF THE PREFERRED EMBODIMENTS

Figure 1:
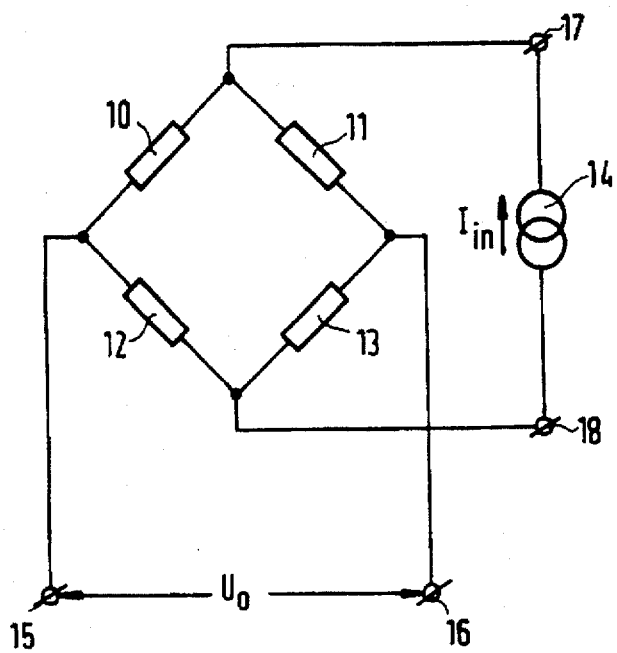
FIG. 1 shows diagrammatically a Wheatstone bridge.

FIG. 1 shows the equivalent diagram of the bridge, composed of magnetoresistive elements 10, 11, 12, 13 in accordance with the invention, and a current source 14 for a current $I_{in}$ connected to the terminals 17 and 18. The output voltage $U_o$ is present across the terminals 15 and 16. The bridge can be operated by voltage control or current control. In comparison with voltage control, the current control shown here offers the advantage that a decrease of the output voltage $U_o$ in the event of an increasing temperature, due to a decrease of the relative magnetoresistive effect, is partly compensated for by an increase of the absolute value of the magnetoresistive elements 10, 11, 12, 13 in the bridge and which is caused by a positive temperature coefficient of the resistance material.

Figure 2:
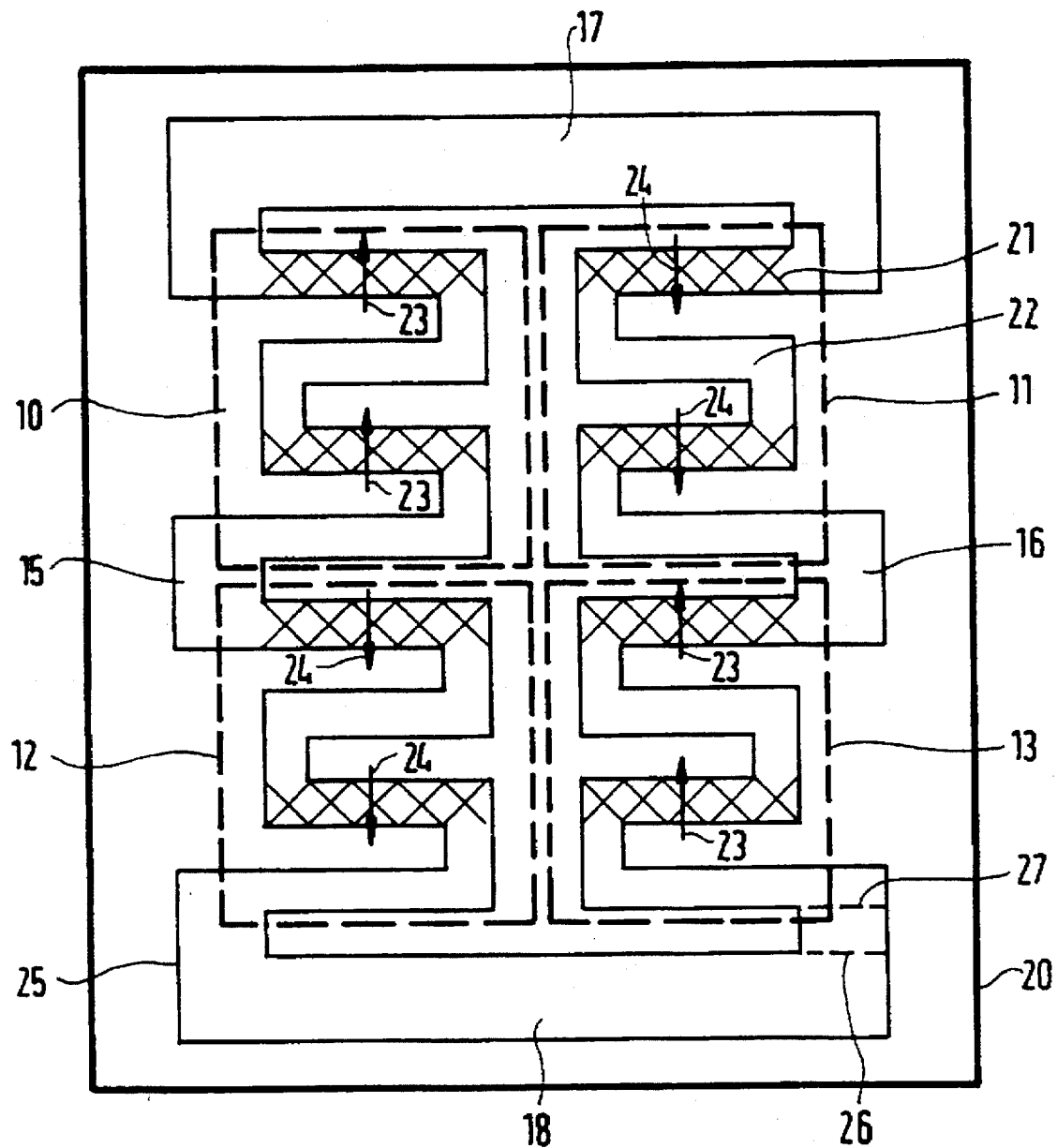
FIG. 2 shows a pattern of conductors with four magnetoresistive elements which together constitute a Wheatstone bridge.

FIG. 2 shows the conductor pattern 25 which can be used in a sensor in accordance with the invention. The conductor pattern 25 is provided in an insulated fashion on a substrate, for example, underneath the conductor pattern 45 or, for example, above and underneath the conductor pattern 45, so that these patterns overlap. These layers can be deposited, for example, by thin-film technology. The dimensions of such a sensor are, for example, 1×2 mm².

The conductor pattern 25 constitutes a bridge circuit in which each magnetoresistive element 10, 11, 12, 13 comprises a meandering conductor pattern in which each time a portion 21 (shown as two strip-shaped portions) consists of a spin-valve magnetoresistive material, and another portion 22 is made of a conductor whose resistance is not dependent on the magnetic field. Also present are four terminals 15, 16, 17, 18. In order to achieve the bridge effect the four magnetoresistive elements 10, 11, 12, 13 of the bridge need not occupy the position shown in FIG. 2. Arrows 23 and 24 in each portion of the four magnetoresistive elements 10, 11, 12, 13 denote the magnetization direction of the second ferromagnetic layer 34. By choosing this direction as indicated, the resistance variation in response to a variation of an external magnetic field will be the same in the magnetoresistive elements in opposite branches of the bridge, for example, the same in the magnetoresistive element 10 as in the magnetoresistive element 13, and opposed in magnetoresistive elements in adjacent branches of the bridge, for example in the elements 10 and 11.

Figure 3A:
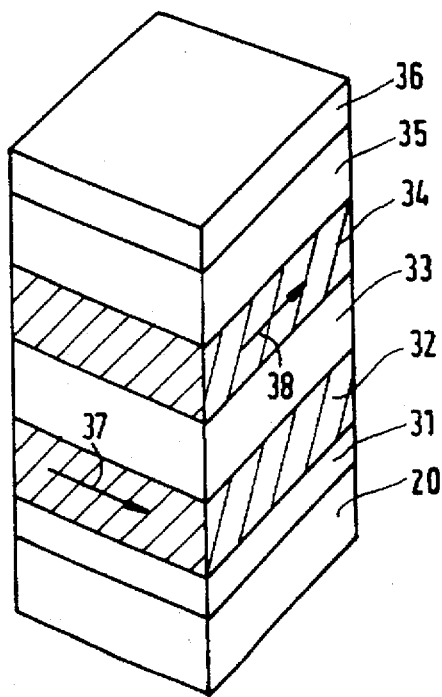
FIGS. 3A and 3B shows diagrammatically the construction of a part of a layered magnetoresistive element suitable for use in a sensor in accordance with the invention.

FIG. 3A shows the construction of a part of a magnetoresistive element as can be used according to the invention. The composition of the material of a magnetoresistive element is described in the non-prepublished European Patent Application No. 93202875.6 and can be obtained, for example, by successively depositing on a high-resistance silicon substrate 20: a first Ta layer 31, a first NiFe layer 32, a Cu layer 33, a second NiFe layer 34, an FeMn layer 35 and a second Ta layer 36. The first Ta layer 31 stimulates defect-free growth with a strong crystallographic structure and the second Ta layer 36 serves for protection against oxidation.

Figure 3B:
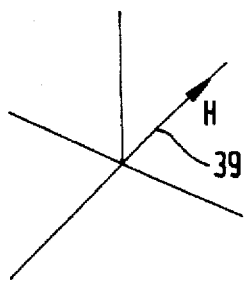

Furthermore, an arrow 37 in FIG. 3A denotes the direction of the anisotropy of the first NiFe layer 32 and an arrow 38 denotes the direction of the effective anisotropy of the second NiFe layer 34. An arrow 39 in FIG. 3B denotes the component of a magnetic field H to be measured which is directed parallel to the effective anisotropy of the second NiFe layer 34. In the magnetoresistive elements 10, 11, 12, 13 used in accordance with the invention the easy magnetization direction of the sensitive ferromagnetic material of the first layer 32 extends substantially perpendicularly to the effective anisotropy of the second ferromagnetic layer 34. In this application, in which the magnetoresistive elements 10, 11, 12, 13 are shaped as a narrow strip, the easy magnetization direction of the sensitive first NiFe layer 32 extends parallel to the longitudinal axis of the strip. The easy magnetization direction of the first NiFe layer 32 is determined by the shape anisotropy of the strip and by the magnetocrystalline anisotropy induced by means of a magnetic field applied during the growth of the NiFe layer 32.

The non-prepublished European Patent Application No. 93202875.6 describes two methods suitable to obtain this substantially perpendicular configuration of the two NiFe layers 32 and 34 in spin-valve materials.

It is also to be noted that for a magnetoresistive element in which the antiferromagnetic layer is replaced by a ferromagnetic layer having a high coercivity, the effective anisotropy of the second ferromagnetic layer can also be defined by exchange interaction.

Figure 4:
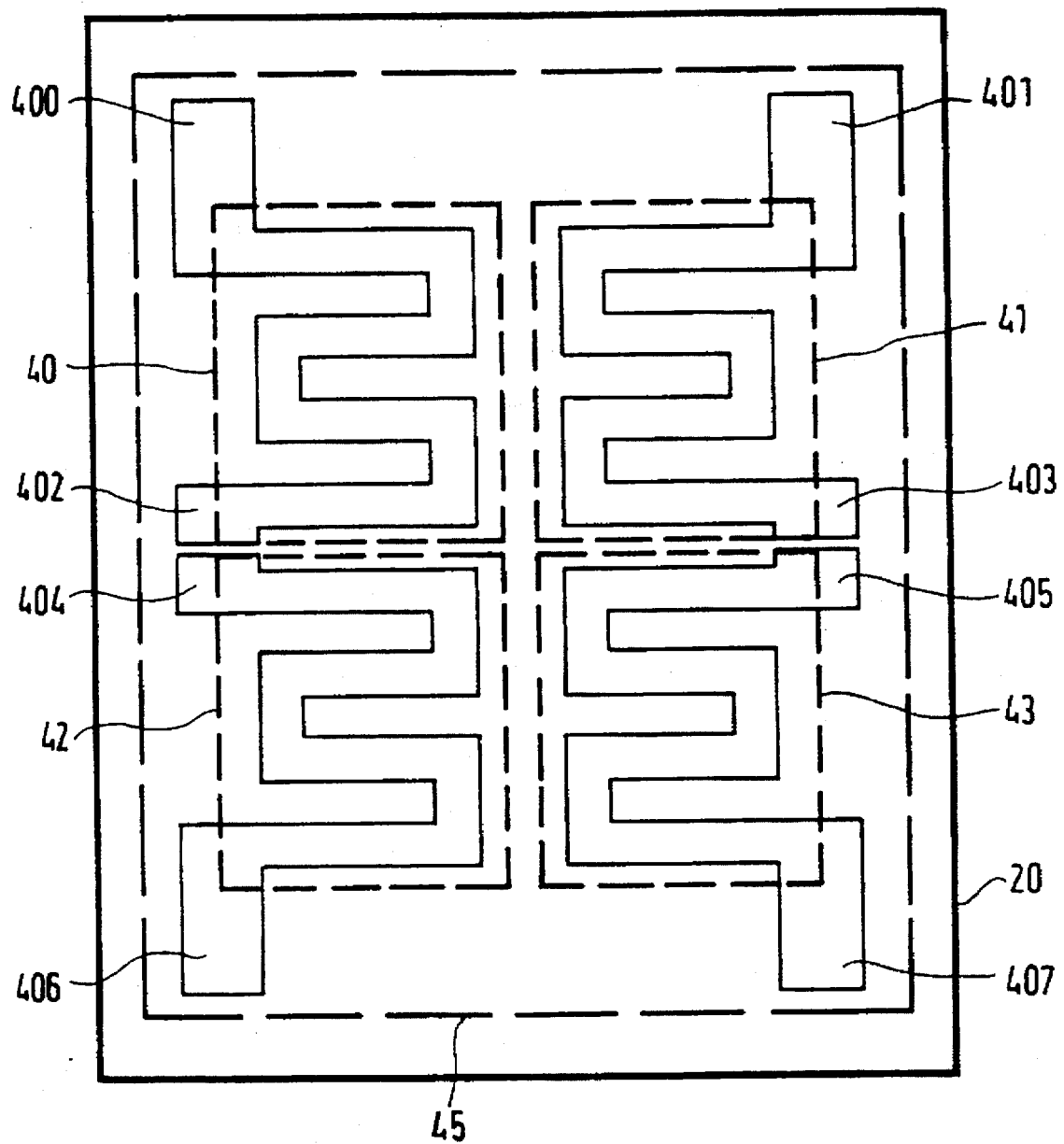
FIG. 4 shows a pattern of current conductors for generating auxiliary fields.

FIG. 4 shows a conductor pattern 45 used as a current conductor in a sensor in accordance with the invention. This conductor pattern 45 is provided on a substrate 20 in an insulated fashion, for example above the conductor pattern 25, in such a manner that the patterns overlap. The conductor pattern 45 is used to apply magnetic auxiliary fields to enable the sensor to operate in an optimum working range. The optimum working ranges will be described in detail hereinafter with reference to FIG. 6.

Magnetic field sensors in accordance with the invention can be manufactured in various ways. A first way is, for example, to heat the sensor beyond the "blocking" temperature and to cool it subsequently in locally different magnetic fields generated by means of an accessory with permanent magnets or coils. The blocking temperature is the temperature at which the exchange bias field of the second ferromagnetic layer is substantially zero. The blocking temperature of, for example a suitable FeMn alloy is 140° C.

A second method consists, for example, of the local heating of, for example, the magnetoresistive elements 10 and 13 on the substrate 20 to a temperature beyond the blocking temperature, followed by cooling in a uniform magnetic field to a temperature below the blocking temperature, and subsequently the heating of, for example, the magnetoresistive elements 11 and 12, followed by cooling in an external magnetic field of opposite direction.

A third method is a version of the first method in which the current conductors 40, 41, 42, 43 on the substrate generate the locally different magnetic fields. According to this third method the substrate as a whole is heated beyond the blocking temperature, and during the subsequent cooling to a value below the blocking temperature locally different magnetic auxiliary fields are generated via the current conductors 40, 41, 42, 43 arranged above the magnetoresistive elements 10, 11, 12, 13.

The latter method it is to be preferred because it does not require external tools. For the described third method of manufacture the current conductors 40, 41, 43, 43 are connected to a negative pole of a voltage source by way of the terminals 402, 403, 404, 405, respectively, and the terminals 400, 401, 406, 407 are connected to a positive pole of the voltage source, or vice versa.

The current conductors 40, 41, 42, 43 may also be used, for example to compensate a small field offset between the characteristics 64 or 65 of the magnetoresistive elements 10, 11, 12, 13 in the bridge. This field offset may be due, inter alia, to small differences in magnetic coupling between the NiFe layers and can be compensated by positioning the magnetoresistive elements 10, 11, 12, 13 in the optimum range of the characteristic 64 or 65 by application of a magnetic auxiliary field by means of a current flowing through the current conductors 40, 41, 42, 43.

Further to these examples, the current conductors 40, 41, 42, 43 can also be used, for example, for calibration purposes in the case of a persisting bridge unbalance, or an unbalance occurring due to, for example, temperature variations. The output voltage $U_o$ (see FIG. 1) can be corrected by subtracting from the output voltage $U_o$ the mean value of the output voltages for both extreme drives to a positive field and a negative field. These drives can be obtained, for example by applying a bias current to the current conductors 40, 41, 42, 43. In order to set the magnetoresistive layers to a magnetically suitably defined state again after such extreme driving, use can be made of an external coil whereby a longitudinal field is briefly generated parallel to the longitudinal direction of the magnetoresistive portions after such extreme driving.

Figure 5:
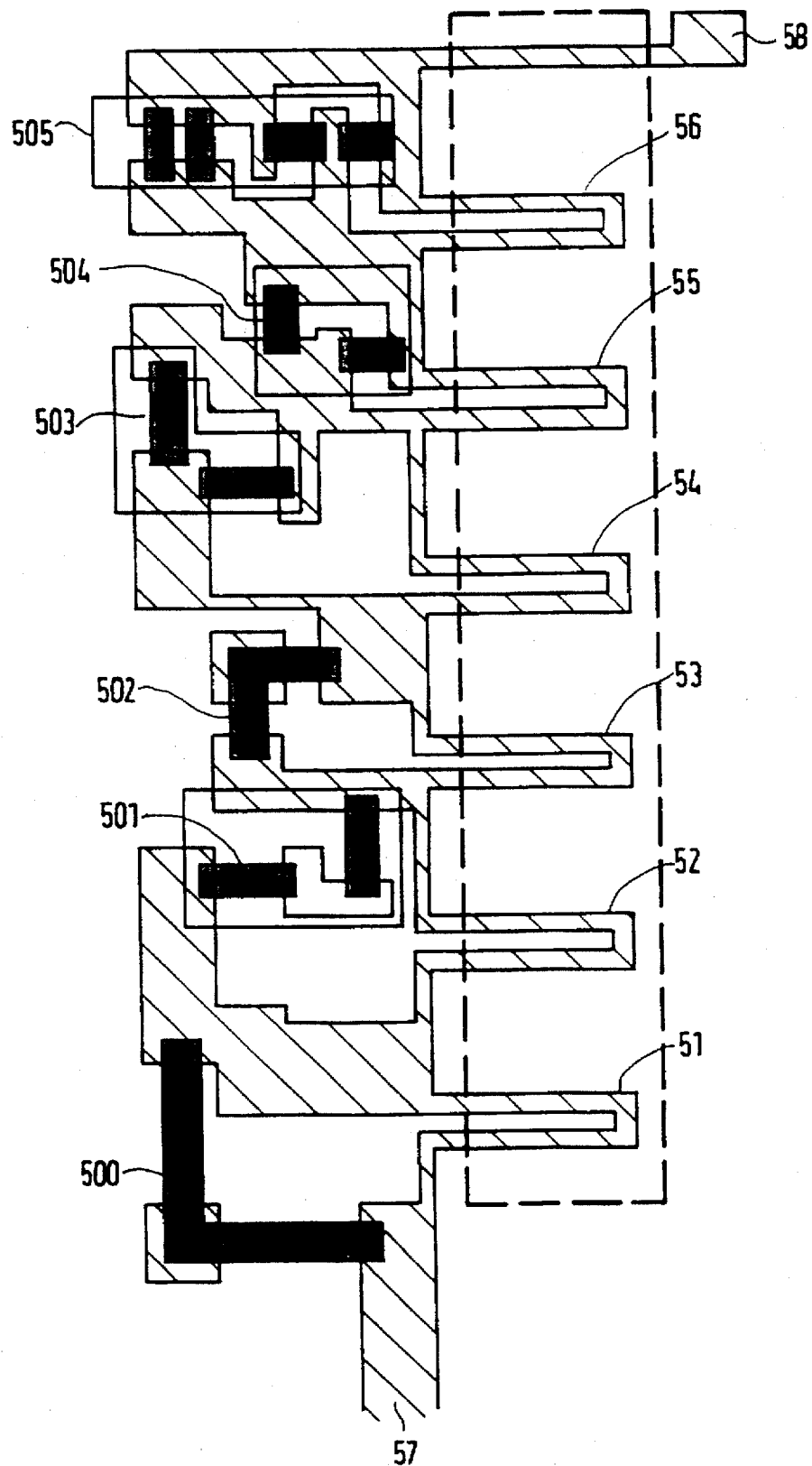
FIG. 5 shows an example of a trimmer resistor.
Figure 6A:
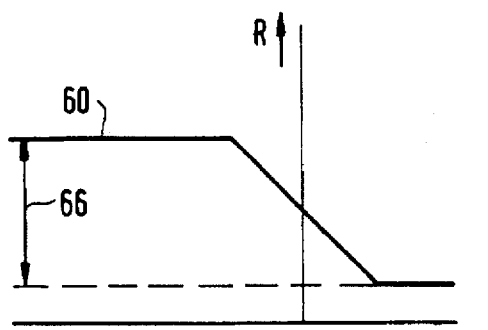
FIGS. 6A, 6C and 6E show a characteristic with a negative slope of a magnetoresistive element as can be used in accordance with the invention.
Figure 6B:
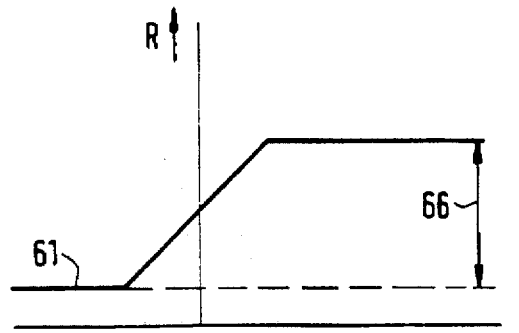
FIGS. 6B, 6D and 6F show a characteristic of a magnetoresistive element with a positive slope as can be used in accordance with the invention.
Figure 6C:
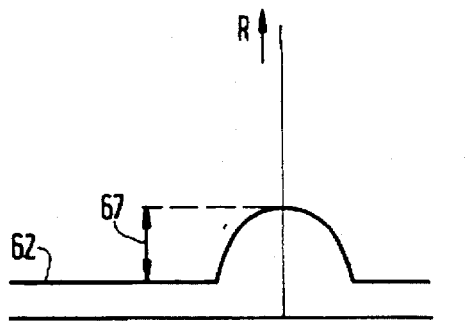
Figure 6D:
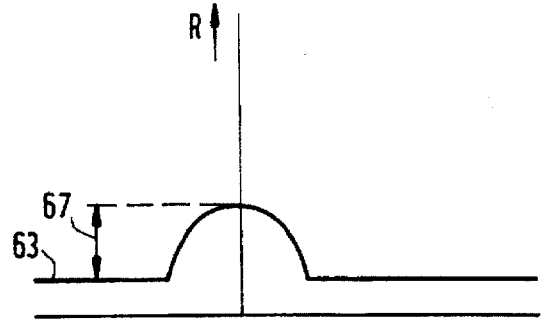
Figure 6E:
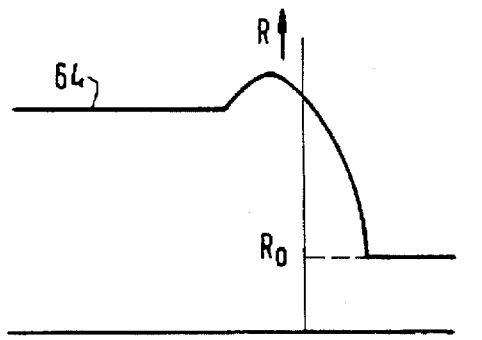
Figure 6F:
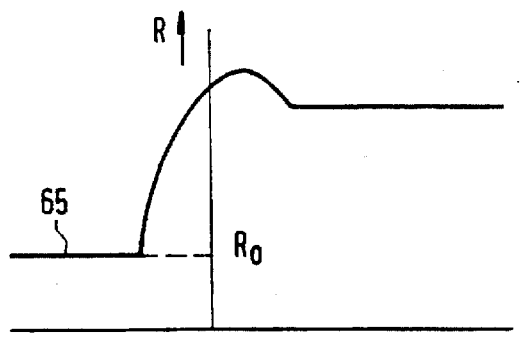

FIG. 5 shows an example of a trimmer resistor as can be used according to the invention. This resistor can be connected in the bridge, in series with one of the magnetoresistive elements 10, 11, 12 or 13, by arranging the terminals 57 and 58 of the pattern 50, for example on the terminals 26 and 27 of the substrate 20. This trimmer resistor can be used during manufacture to compensate an unbalance in the bridge as caused by deviations between the magnetoresistive elements. This is of importance for measurements of small static magnetic fields. After measurement of the deviation and calculation of the compensation value for the trimmer resistor, the value of this trimmer resistor is adjusted by opening one or more U-shaped connections 51, 52, 53, 54, 55 and 56 in the pattern 50 formed by the resistors 500, 501, 502, 503, 504 and 505 having the values 32Ra, 16Ra, 8Ra, 4Ra, 2Ra and Ra, respectively. The adjusted value of the trimmer resistor can thus vary between 0 and 63Ra, Ra being a resistance value to be laid down in the design. The connections 51, 52, 53, 54, 55 and 56 can be opened, for example, by means of a laser of adequate power.

FIGS. 6A–6F show the characteristics 64 and 65 of the magnetoresistive elements as used according to the invention. The characteristic 64 concerns, for example, the magnetoresistive elements 10 and 13 and the characteristic 65 concerns, for example, the magnetoresistive elements 11 and 12. The characteristic 64 is a superposition of a spin-valve magnetoresistive characteristic 60, being linear in a first approximation, and a quadratic characteristic 62 caused by the anisotropic magnetoresistive effect. Similarly, the characteristic 65 is a superposition of a characteristic 61 and the characteristic 63. For each magnetoresistive element the anisotropic magnetoresistive effect equals a given value 67. The resistance becomes lower when the magnetization is set perpendicularly to the current direction in an external magnetic field. A description of the anisotropic magnetoresistive effect is given, for example in Technical Publication 268, Philips Electronic Components and Materials, 1988. The difference in resistance 66 is caused by the spin-valve effect.

Various methods of operating the magnetic field sensor can be deduced from the characteristics 64, 65. A first method consists in that, for example each magnetoresistive element is operated in a range of the characteristic 64 or 65 without a magnetic auxiliary field, and a second method consists in that each magnetoresistive element is operated in a range in which the slope of the characteristic is maximum.

According to the first method, for a balanced bridge the output voltage $U_o$ for a sufficiently small H is substantially linear and given by:

$$U_o(H) = I_{br} s H R_0, \quad (1)$$

in which s is the contribution by the spin-valve effect to the sensitivity of the magnetoresistive material; this can be expressed in a formula as $$s = \frac{1}{R_0} \frac{dR}{dH},$$

R being the resistance of a single magnetoresistive element and H the field strength to be measured. $R_0$ is the minimum saturation resistance of the magnetoresistive element. In that case the anisotropic magnetoresistive effect does not contribute to the signal because it is the same for each magnetoresistive element.

A bias current can be applied to the current conductors 40, 41, 42, 43 in order to enhance the linearity even further by feedback, if necessary. To this end, the current conductors 40, 41, 42, 43 are connected to one another in such a manner that 400 is an input, 401 is an output, and the terminals 402 and 404, 406 and 407, 403 and 405 are connected to one another.

According to the second method, under the influence of a bias field generated by a current through a superposed current conductor 40, 41, 42, 43, each magnetoresistive element enters, a range of the characteristic 64 or 65 in which the slope is steepest. Consequently, this current is opposed for the magnetoresistive elements 10 and 13.

In order to apply feedback still, the same bias current must be added for each magnetoresistive element. The connection of the current conductors 40, 41, 42, 43 is such that the terminals 402 and 407, 403 and 406 are interconnected, respectively. The bias current for the magnetoresistive elements 10 and 13 then flows between the terminals 400 and 405, and the bias current for the magnetoresistive elements 11 and 12 flows between the terminals 401 and 404. This second method utilizes the anisotropic magnetoresistive effect and the sensitivity of the magnetic field sensor is approximately a factor of two higher.

To increase the sensitivity of the sensor the conductor pattern 25 of the magnetoresistive elements, as shown in FIG. 2, can be replaced by a conductor pattern in which each strip-shaped portion comprises several single domain circle-shaped structures.

Figure 7:
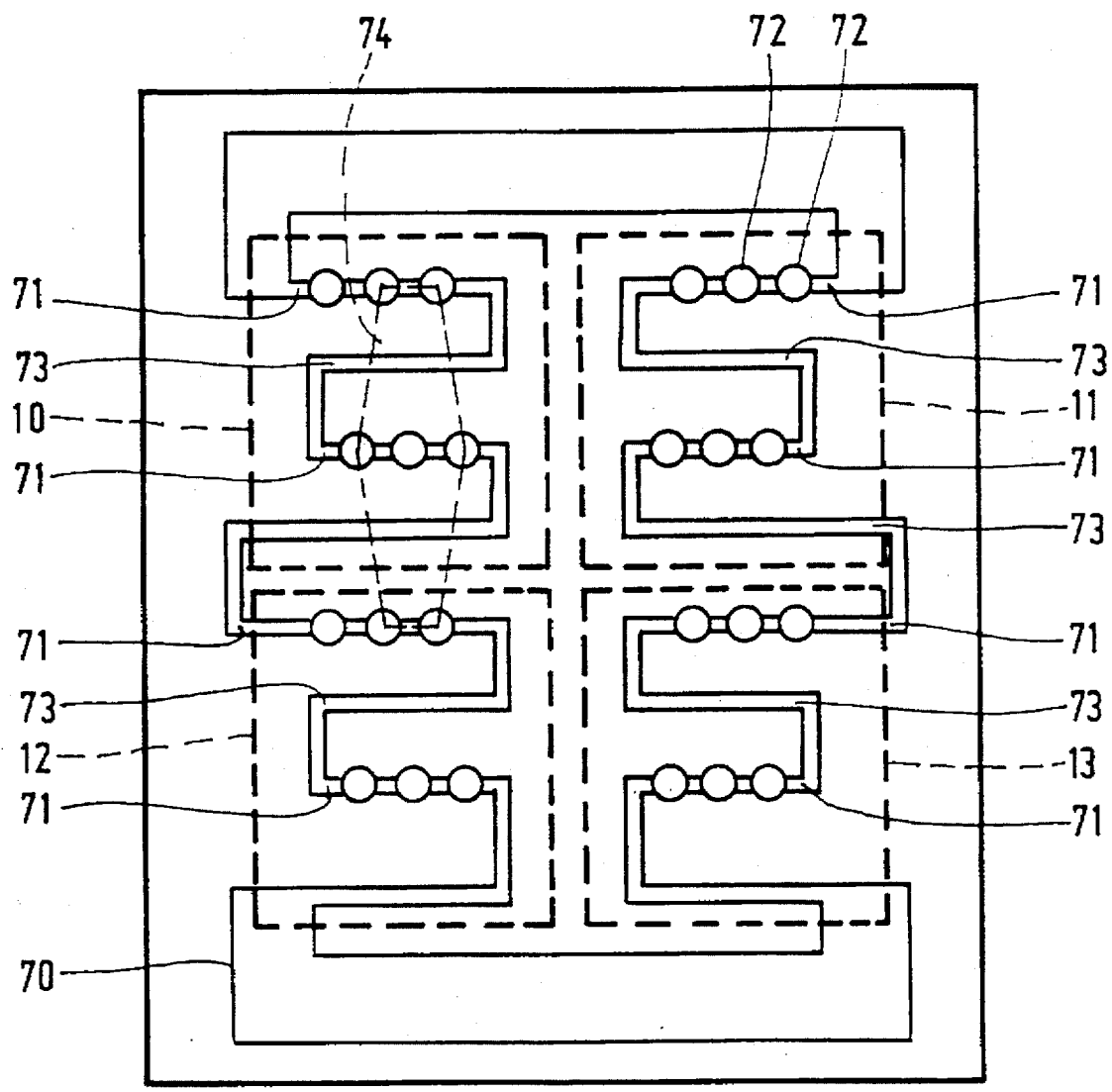
FIG. 7 shows a pattern of conductors with four magnetoresistive elements, in which the magnetoresistive elements comprise circular shaped portions.

FIG. 7 shows the conductor pattern 70 with the strip-shaped portions 71 comprising single domain circle-shaped structures 72. The conductor pattern 70 constitutes a bridge circuit in which each magnetoresistive element 10,11,12,13 comprises a portion 71, shown as two stripe-shaped portions, which consists of several circle-shaped structures 72. The circle-shaped structures 72 are interconnected by a conductor whose resistance is not dependent of the magnetic field. Furthermore, the meandering conductor pattern comprises the portions 73, which portions are also made of a conductor whose resistance is not dependent on the magnetic field.

The diameter of the circle-shaped single domain structures has to be smaller than the average dimension of a single domain of a large uninterrupted layer of magnetoresistive material without anisotropy. Further the directions of the easy magnetisation axes of the single domain structures of the magnetoresistive elements can be pointed to the same direction if a magnetic field is present during the growth of the NiFe-layer 32 and/or by introducing a small shape anisotropy by the application of ellipse-shaped structures, whose long axes are pointed to the longitudinal direction of the strip-shaped portion 71 of the magnetoresistive element. In order to diminish the mutual interactions of the circle-shaped single-domain portions 71 of the magnetoresistive elements, the circular-shaped structures 72 or the ellipse-shaped structures are arranged in a hexagonal grid. By way of example, in FIG. 7 a hexagon 74 is drawn between six circular-shaped structures 72 on three adjacent strip-shaped portions 71.

We claim:

1. A magnetic field sensor, comprising: a Wheatstone bridge having at least four layered magnetoresistive elements on a substrate, each element comprising at least three layers, comprising successively a first ferromagnetic layer, a non-magnetic layer and a second ferromagnetic layer, wherein each of the magnetoresistive elements comprises two or more strip-shaped portions which extend in mutually parallel directions, the first ferromagnetic layer exhibits uni-axial anisotropy in one plane and the second ferromagnetic layer exhibits uni-axial or uni-directional anisotropy in one further plane, the magnetization of the second ferromagnetic layer being determined by exchange interaction with an antiferromagnetic layer provided on the second ferromagnetic layer, and wherein magnetoresistive elements arranged in two adjacent branches of the bridge circuit have approximately opposite magnetization directions of the second ferromagnetic layers.

2. A sensor as claimed in claim 1, wherein in the absence of an external magnetic field, in each magnetoresistive element the magnetization of the first ferromagnetic layer extends substantially perpendicular to the magnetization of the second ferromagnetic layer.

3. A sensor as claimed in claim 1, wherein each strip-shaped portion comprises several single domain structures which are located adjacent to each other in a direction parallel to the longitudinal direction of the strip-shaped portion and connected to each other by a conductor.

4. A sensor as claimed in claim 3, wherein the single domain structures of several adjacent strip-shaped portions are positioned to form a hexagonal grid.

5. A sensor as claimed in claim 1, further comprising a current conductor in the immediate vicinity of each strip-shaped portion of a magnetoresistive element, wherein a longitudinal direction of a current conductor extends parallel to the longitudinal direction of the strip-shaped portion of the magnetoresistive element, the magnetization direction of the second ferromagnetic layer of the associated magnetoresistive elements extending substantially perpendicularly to the longitudinal direction of the current conductors.

6. A sensor as claimed in claim 1, further comprising a trimmer resistor connected in series with at least one magnetoresistive element, and wherein each of the magnetoresistive elements of the Wheatstone bridge has substantially the same magnetoresistance value.

7. A sensor as claimed in claim 2, wherein each strip-shaped portion comprises several single domain structures which are located adjacent to each other in a direction parallel to the longitudinal direction of the strip-shaped portion and serially connected to each other by a conductor.

8. A sensor as claimed in claim 2, further comprising a current conductor in the immediate vicinity of each strip-shaped portion of a magnetoresistive element, wherein a longitudinal direction of a current conductor extends parallel to the longitudinal direction of the strip-shaped portion of the magnetoresistive element, the magnetization direction of the second ferromagnetic layer of the associated magnetoresistive elements extending substantially perpendicularly to the longitudinal direction of the current conductors.

9. A sensor as claimed in claim 3, further comprising a current conductor in the immediate vicinity of each strip-shaped portion of a magnetoresistive element, wherein a longitudinal direction of a current conductor extends parallel to the longitudinal direction of the strip-shaped portion of the magnetoresistive element, the magnetization direction of the second ferromagnetic layer of the associated magnetoresistive elements extending substantially perpendicularly to the longitudinal direction of the current conductors.

10. A sensor as claimed in claim 4, further comprising a current conductor in the immediate vicinity of each strip-shaped portion of a magnetoresistive element, wherein a longitudinal direction of a current conductor extends parallel to the longitudinal direction of the strip-shaped portion of the magnetoresistive element, the magnetization direction of the second ferromagnetic layer of the associated magnetoresistive elements extending substantially perpendicularly to the longitudinal direction of the current conductors.

11. A sensor as claimed in claim 2, further comprising a trimmer resistor connected in series with at least one magnetoresistive element to compensate a bridge unbalance caused by deviations between the magnetoresistive elements.

12. A sensor as claimed in claim 3, further comprising a trimmer resistor connected in series with only one magnetoresistive element.

13. A magnetic field sensor as claimed in claim 1 wherein said four magnetoresistive elements are laid out in one plane in the form of a rectangle such that the magnetization directions of the respective second ferromagnetic layers of diagonally opposed magnetoresistive elements are in the same direction and are in opposition in adjacent magnetoresistive elements whereby the magnetic field sensor is operative to measure a magnetic field without a magnetic auxiliary field.

14. A magnetic field sensor as claimed in claim 1 wherein all of the strip-shaped portions of each magnetoresistive element of the Wheatstone bridge extend in mutually parallel directions.

15. An instrument for measuring a magnetic field, comprising: a Wheatstone bridge having at least four layered magnetoresistive elements on a substrate, each element including at least three layers, comprising successively a first ferromagnetic layer, a non-magnetic layer and a second ferromagnetic layer, wherein each of the magnetoresistive elements comprises one or more strip-shaped portions which extend in mutually parallel directions, the first ferromagnetic layer exhibits uni-axial anisotropy in one plane and the second ferromagnetic layer exhibits uni-axial or uni-directional anisotropy in one further plane, the magnetization of the second ferromagnetic layer being determined by exchange interaction with an antiferromagnetic layer provided on the second ferromagnetic layer, and wherein magnetoresistive elements arranged in two adjacent branches of the bridge circuit have approximately opposite magnetization directions of the second ferromagnetic layers.

16. An instrument as claimed in claim 15 further comprising a current conductor in the immediate vicinity of each strip-shaped portion of a magneto-resistive element, wherein a longitudinal direction of a current conductor extends parallel to the longitudinal direction of the strip-shaped portion of the magnetoresistive element, the magnetization direction of the second ferromagnetic layer of the associated magnetoresistive elements extending substantially perpendicular to the longitudinal direction of the current conductors.

17. An instrument as claimed in claim 16, wherein the instrument comprises a control unit which is arranged to conduct a current through each of the current conductors in order to generate a magnetic auxiliary field for adjustment of a working point in the characteristic for the measurement of an external field.

18. An instrument as claimed in claim 17, wherein the instrument comprises a control unit which is arranged to conduct a current through each of the current conductors whereby the output voltage of the bridge is maintained at a constant value by feedback, and also comprises means for measuring the current flowing through the current conductors.

19. An instrument as claimed in claim 17, which further comprises a control unit arranged to conduct a current through each of the current conductors in order to generate a magnetic field for saturating the magnetoresistive elements.

20. An instrument as claimed in claim 16, wherein the instrument comprises a control unit which is arranged to conduct a current through each of the current conductors whereby the output voltage of the bridge is maintained at a constant value by feedback, and also comprises means for measuring the current flowing through the current conductors.

21. An instrument as claimed in claim 20, which further comprises a control unit arranged to conduct a current through each of the current conductors in order to generate a magnetic field for saturating the magnetoresistive elements.

22. An instrument as claimed in claim 16, which further comprises a control unit arranged to conduct a current through each of the current conductors in order to generate a magnetic field for saturating the magnetoresistive elements.

23. A method of manufacturing a sensor formed of magnetoresistive elements which are arranged in a bridge on a substrate, which magnetoresistive elements each comprise at least two strip-shaped elements in parallel and with first and second ferromagnetic layers which exhibit uni-axial anisotropy in one plane and which are separated by a non-ferromagnetic layer, and a current conductor near each strip-shaped element and with its longitudinal direction extending parallel to the longitudinal direction of the strip-shaped portion of the magnetoresistive element, the magnetization direction of the second ferromagnetic layer of the associated magnetoresistive elements extending substantially perpendicular to the longitudinal direction of the current conductors, the magnetization of the second ferromagnetic layer being determined by exchange interaction with an antiferromagnetic layer provided on the second ferromagnetic layer, said method comprising: exposing the second ferromagnetic layer and the antiferromagnetic layer, at a temperature higher than a blocking temperature, to a magnetic field which is generated by an electric current flowing in the current conductors, subsequently lowering the temperature of said layers to a value below the blocking temperature while sustaining the magnetic field.

\* \* \* \* \*